(12) United States Patent
Inoue et al.

(10) Patent No.: US 7,394,048 B2
(45) Date of Patent: Jul. 1, 2008

(54) FOCUSING DEVICE, FOCUSING METHOD AND A PATTERN INSPECTING APPARATUS

(75) Inventors: Hiromu Inoue, Yokohama (JP); Tomohide Watanabe, Yokohama (JP); Satoshi Endo, Fuji (JP); Masami Ikeda, Numazu (JP)

(73) Assignees: Kabushiki Kaisha Toshiba, Tokyo (JP); NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 11/679,411

(22) Filed: Feb. 27, 2007

(65) Prior Publication Data

US 2007/0200051 A1    Aug. 30, 2007

(30) Foreign Application Priority Data

Feb. 28, 2006    (JP) ............................. 2006-052995

(51) Int. Cl.
*G02B 7/04* (2006.01)
(52) U.S. Cl. ................................. 250/201.2; 250/201.4
(58) Field of Classification Search ... 250/201.2–201.5, 250/548; 356/609, 624; 396/79, 80, 82; 359/383; 369/44.14
See application file for complete search history.

(56) References Cited

U.S. PATENT DOCUMENTS

2007/0280664 A1* 12/2007 Ikeda et al. ................ 396/114

FOREIGN PATENT DOCUMENTS

| JP | 60-26311 | 2/1985 |
| JP | 9-49965 | 2/1997 |
| JP | 11-271597 | 10/1999 |

* cited by examiner

*Primary Examiner*—Kevin Pyo
(74) *Attorney, Agent, or Firm*—Oblon, Spivak, McClelland, Maier & Neustadt, P.C.

(57) ABSTRACT

A focusing device comprises a first imaging optical system, a second imaging optical system which splits the optical image in the direction of an AF sensor and further splits the optical image so that a front focus image in which the point that is in focus is in front of the optical image on the inspecting sensor and a back focus image in which the point that is in focus is behind the optical image on the inspecting sensor are formed on the AF sensor, a focus detecting circuit which detects an optimum focus position on the basis of a high-frequency component of a front sensor image in a front focus position and a high-frequency component of a back sensor image in a back focus position, and a focus control circuit which controls the focusing of the first imaging optical system on the basis of the focus position.

6 Claims, 8 Drawing Sheets

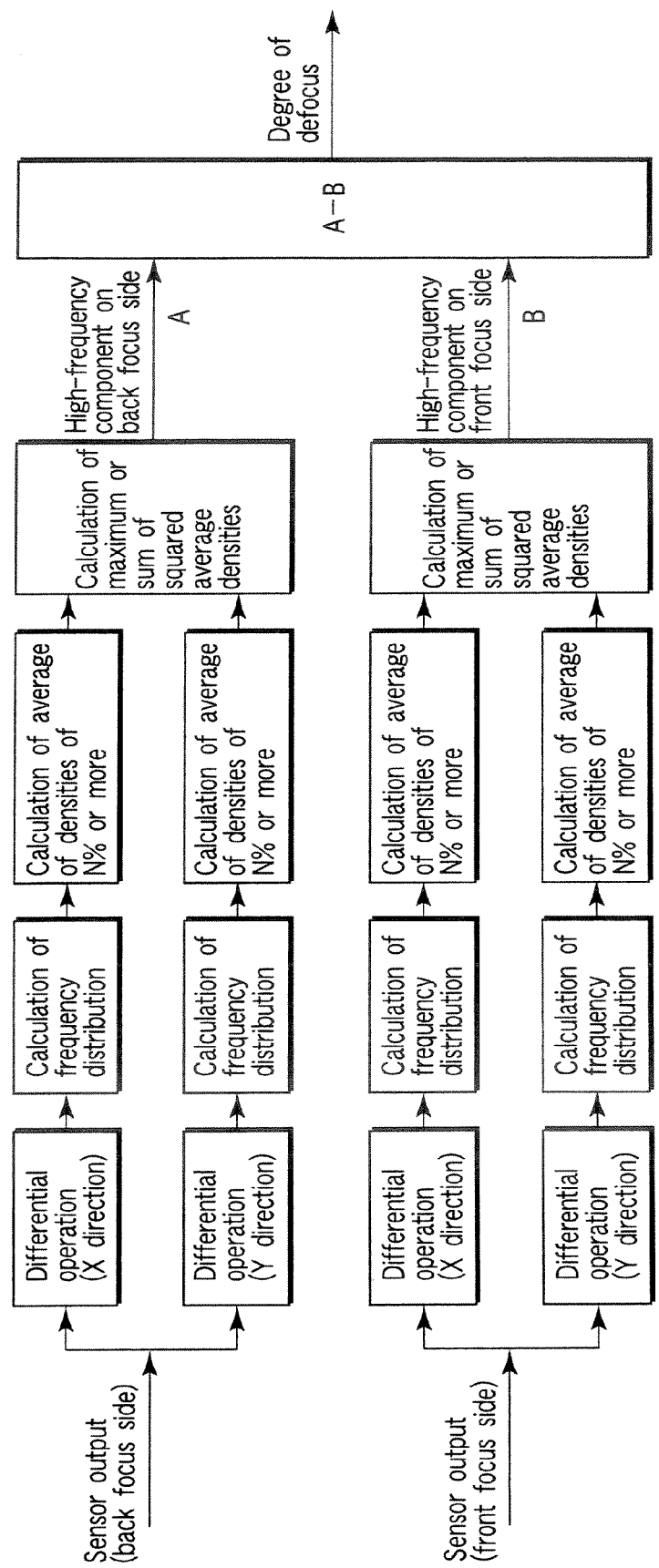
F I G. 3

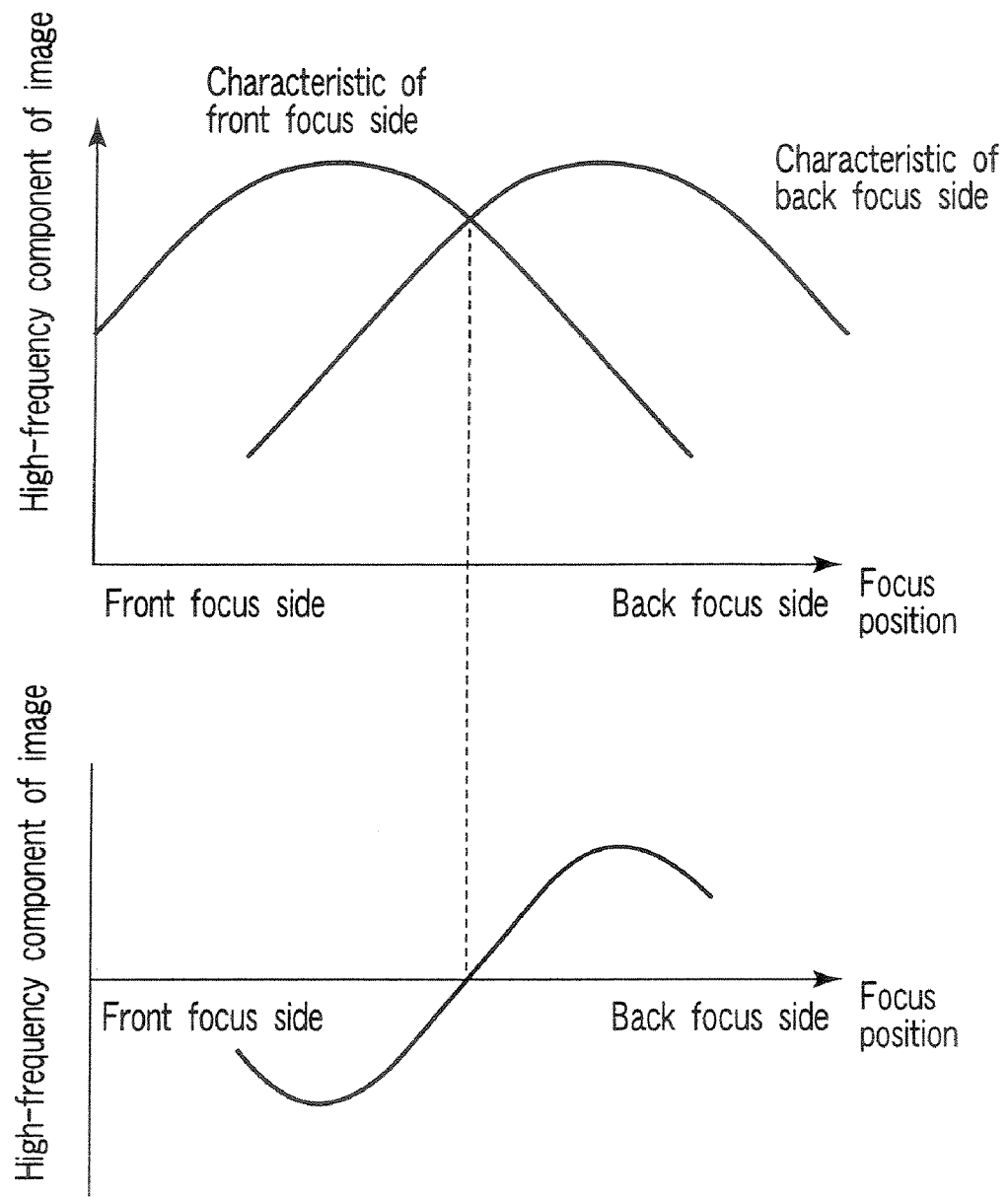
F I G. 14

FOCUSING DEVICE, FOCUSING METHOD AND A PATTERN INSPECTING APPARATUS

CROSS-REFERENCE TO RELATED APPLICATIONS

This application is based upon and claims the benefit of priority from prior Japanese Patent Application No. 2006-052995, filed Feb. 28, 2006, the entire contents of which are incorporated herein by reference.

BACKGROUND OF THE INVENTION

1. Field of the Invention

The present invention relates to a focusing device and a focusing method that are used in an optical system mounted in a measuring and inspecting apparatus for semiconductor patterns of a semiconductor wafer, a photo mask and the like, and more particularly, to a technique for detecting precise focus even in the case where a line width or defect in a semiconductor pattern is not greater than the wavelength of an illuminating light used for focus detection.

2. Description of the Related Art

A measuring and inspecting apparatus for semiconductor patterns of a semiconductor wafer, a photo mask and the like is required to measure the line width of a pattern highly accurately by using an optical image and to detect even slight defects in a pattern with high resolving power.

Such a semiconductor pattern measuring and inspecting apparatus forms an enlarged optical image of a semiconductor pattern on a sensor, such as a charge coupled device (CCD). An electric image signal obtained by the sensor is processed for measurement and inspection. Highly accurate measurement and inspection require the formation of an optical image at high magnification and resolution. Accordingly, the optical image must be precisely focused.

FIG. 15 shows a focusing mechanism 100 that employs an optical lever method. In FIG. 15, reference symbol W denotes a subject; reference numeral 101 denotes an inspecting sensor; 102 denotes an objective lens; 103 denotes an imaging lens; 104 denotes an LD; 105 denotes a position sensor; 106 denotes a focus detecting circuit; and 107 denotes a focus control circuit. Using LD light, the focusing mechanism 100 forms an image of the focus position of the subject W on the position sensor 105, processes the signal of the position sensor 105, measures the degree of defocus, and controls the focusing.

Another focusing mechanism is known (refer to, for example, Jpn. Pat. Appln. KOKAI Publication No. 11-271597), which creates a front focus in which the focus is in front of the subject and a back focus in which the focus is behind the subject, and then determines the focus position on the basis of the difference between an integral value (i.e., contrast) of the light intensity of the image in the front focus state and that in the back focus state.

However, the aforesaid focus detecting method using the optical lever method has suffered from a drawback described below. That is, if a line width or pitch of a semiconductor pattern is not greater than the wavelength of an illuminating light for use in focus detection, light is diffracted by the semiconductor pattern and forms an image on the position sensor, with the result that a focus position may not be accurately detected. The latter focus detecting method, which uses integral values of light intensities, also has the drawback that if a difference between integral values is small, a focus position may not be accurately detected.

BRIEF SUMMARY OF THE INVENTION

Accordingly, it is an object of the present invention to provide a focusing device and a focusing method that realize a technique for detecting a focus precisely even in the case where a line width or pitch of a semiconductor pattern is not greater than the wavelength of an optical system, thereby ensuring highly accurate measurement and inspection.

In order to solve the above-described problem and achieve the object, a focusing device as an aspect of the present invention is configured as follows.

That is, the focusing device comprises: first and second sensors which convert an optical image of a subject, formed on a plane of incidence, into an image signal and output the image signal; a first imaging optical system which forms the optical image on the first sensor; a second imaging optical system which splits the optical image from the first imaging optical system in the direction of the second sensor and further splits the optical image into two so that a front focus image in which the point that is in focus is in front of the optical image on the first sensor and a back focus image in which the point that is in focus is behind the optical image on the first sensor are formed on the second sensor; a focus detecting circuit which detects an optimum focus position of the optical image on the first sensor by calculating a focus evaluation value from a high-frequency component of a front sensor image in a front focus position obtained from the second sensor and a focus evaluation value from a high-frequency component of a back sensor image in a back focus position obtained from the second sensor and by comparing the focus evaluation values; and a focus control circuit which controls the focusing of the first imaging optical system on the basis of the focus position detected by the focus detecting circuit.

Further, in order to solve the above-described problem and achieve the object, a focusing method as another aspect of the present invention is configured as follows.

That is, the focusing method comprises: forming an optical image on a first sensor; converting the optical image formed on the first sensor into an image signal and outputting the image signal as a first image signal; splitting the optical image in the direction of the second sensor and further splitting the optical image into two so that a front focus image in which the point that is in focus is in front of the optical image on the first sensor and a back focus image in which the point that is in focus is behind the optical image on the first sensor are formed on the second sensor; converting the optical image formed on the first sensor into an image signal and outputting the image signal as a second image signal; detecting an optimum focus position of the optical image on the first sensor from the second image signal by calculating a focus evaluation value from a high-frequency component of a front sensor image in a front focus position and a focus evaluation value from a high-frequency component of a back sensor image in a back focus position and by comparing the focus evaluation values; and controlling the focusing of the first imaging optical system on the basis of the detected focus position.

The focusing method comprises: a first imaging step of forming an optical image on a first sensor; a first image signal converting step of converting the optical image formed on the first sensor into an image signal and outputting the image signal; a second imaging step of splitting the optical image in the first imaging step in the direction of the second sensor and further splitting the optical image into two so that a front focus image in which the point that is in focus is in front of the optical image on the first sensor and a back focus image in which the point that is in focus is behind the optical image on the first sensor are formed on the second sensor; a second image signal converting step of converting the optical image formed on the first sensor into an image signal and outputting the image signal; a focus detecting step of detecting an optimum focus position of the optical image on the first sensor from the image signal obtained in the second image signal converting step by calculating a focus evaluation value from a high-frequency component of a front sensor image in a front focus position and a focus evaluation value from a high-frequency component of a back sensor image in a back focus position and by comparing the focus evaluation values; and a focus control step of controlling the focusing of the first imaging optical system on the basis of the focus position detected in the focus detecting step.

In accordance with the invention, a focus can be precisely detected even in the case where a line width or pitch of a pattern on a subject (such as a semiconductor substrate or a photo mask) is not greater than the wavelength of an optical system. Accordingly, the present invention can be applied for precise measurement and inspection of a subject.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a block diagram showing an operating circuit used in the focus detecting device;

FIG. 14 is an explanatory view showing the characteristics of changes in focus evaluation values and the difference between the focus evaluation values.

DETAILED DESCRIPTION OF THE INVENTION

Figure 1:
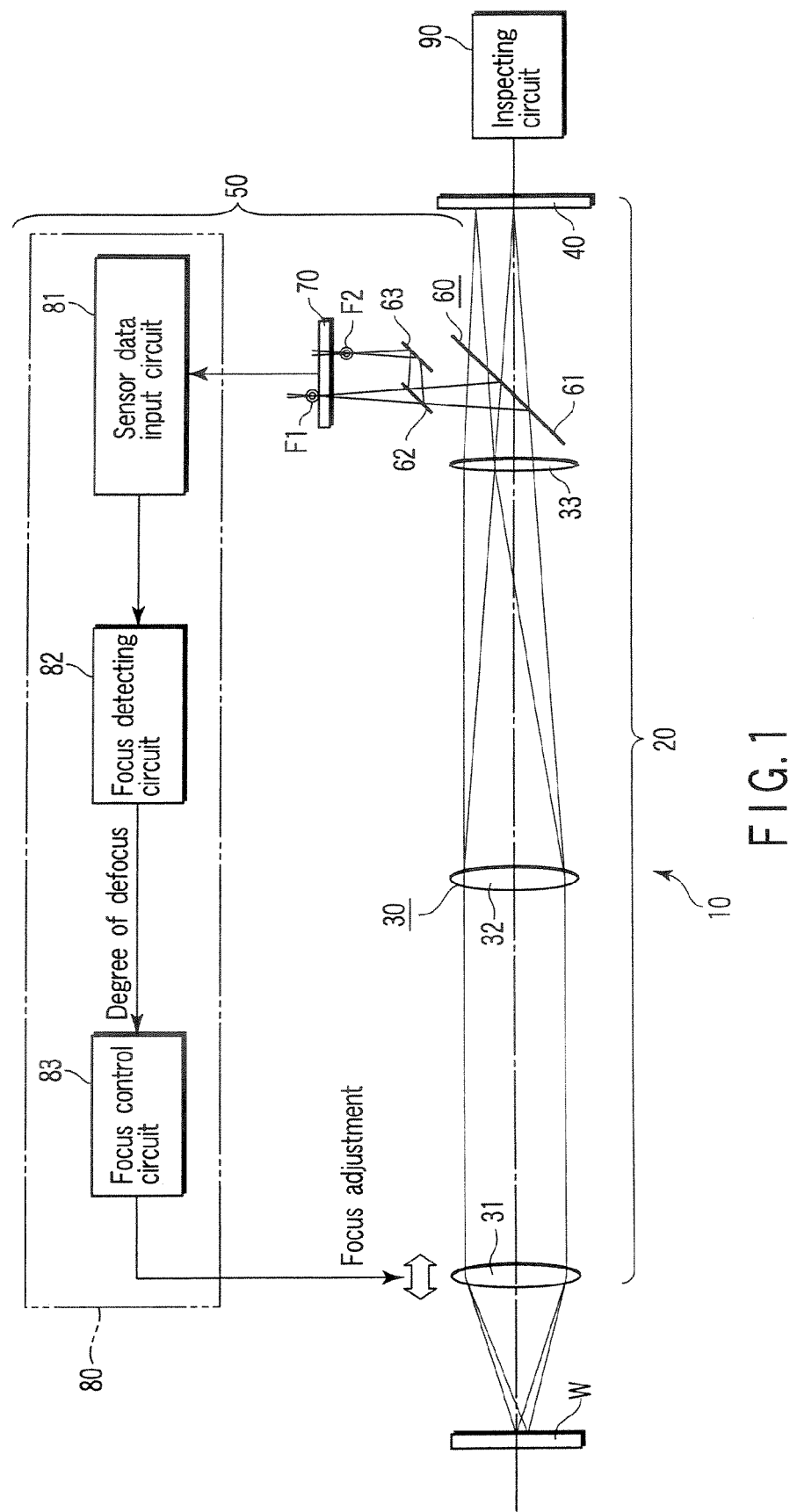
FIG. 1 shows an example of the configuration of a focus detecting device according to an embodiment of the present invention.
Figure 2:
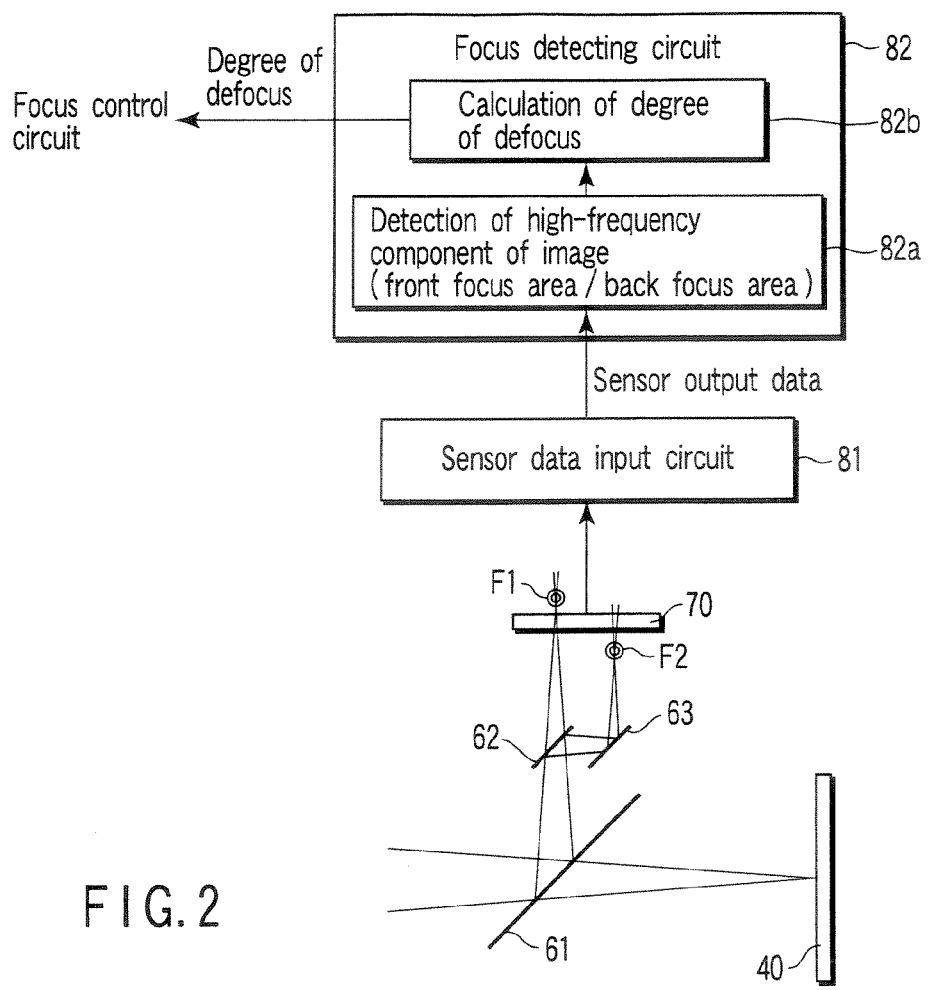
FIG. 2 is an explanatory diagram showing the configuration of the focus detecting device.
Figure 4:
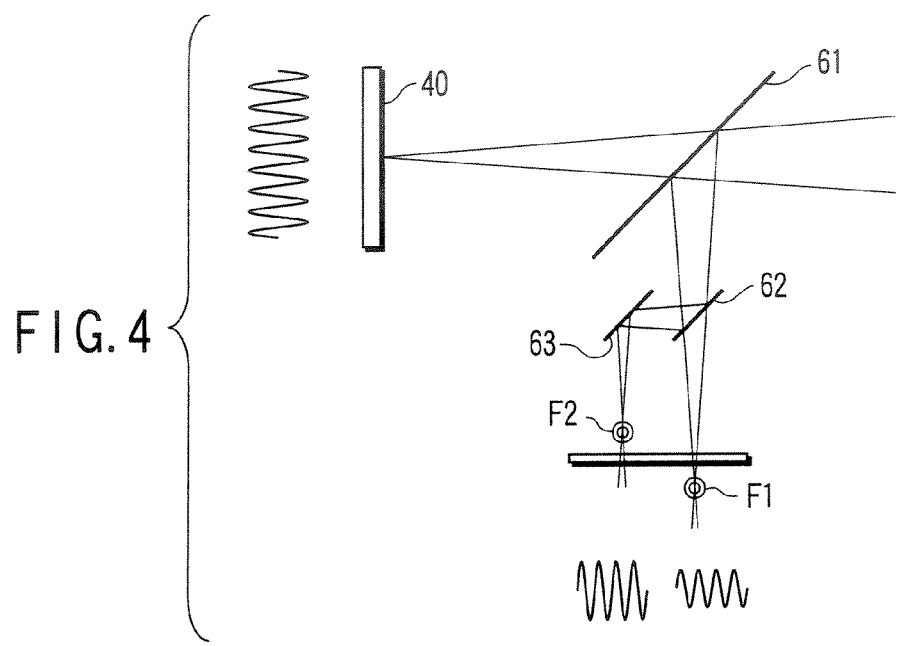
FIG. 4 is an explanatory view showing the focus detecting principle of the focus detecting device.

FIG. 1 is an explanatory diagram showing the configuration of a semiconductor pattern inspecting apparatus 10 incorporating a focus detecting device 50 according to an embodiment of the present invention. FIG. 2 is an explanatory diagram showing the configuration of the focus detecting device 50. FIG. 3 is a block diagram showing a signal processing circuit 80 used in the focus detecting device 50. FIG. 4 is a view for explaining the focus detecting principle of the focus detecting device 50. In FIG. 1, reference symbol W represents a subject, such as a semiconductor wafer on which a pattern is formed.

The semiconductor pattern inspecting apparatus 10 includes: an inspecting device 20 and the aforesaid focus detecting device 50. The inspecting device 20 has a first imaging optical system 30 and an inspecting sensor 40 on which a subject image is formed by the first imaging optical system 30.

The first imaging optical system 30 includes: an objective lens 31 arranged opposite a subject W and used to enlarge an image; an imaging lens 32 for forming an image from light from the objective lens 31 on the inspecting sensor 40; and an additional lens 33 arranged between the imaging lens 32 and the inspecting sensor 40 and incorporating a telecentric optical system on the imaging side of the additional lens 33.

The focus inspecting device 50 includes a second imaging optical system 60, an AF sensor 70, and a signal processing circuit 80. The second imaging optical system 60 has: a first half mirror 61 arranged between the additional lens 33 and the inspecting sensor 40, the first half mirror 61 splitting an optical image to form the split image on the AF sensor 70; a second half mirror 62 arranged between the first half mirror 61 and the AF sensor 70 to further split the optical image; and a mirror 63 that forms an image from light from the second half mirror 62 on the AF sensor 70. The optical length is preset such that the focus of the first half mirror 61 is in a front focus position F1, and the focus of the mirror 63 is in a back focus position F2.

The signal processing circuit 80 includes: a sensor data input circuit 81 to which an image signal from the AF sensor 70 is input; a focus detecting circuit 82 to which a signal is input from the sensor data input circuit 81; and a focus control circuit 83 for controlling a focus adjusting mechanism that determines the position of the objective lens 31.

As the inspecting sensor 40 and the AF sensor 70, it is preferable to use a line sensor, a storage type (e.g., Time Delay and Integration) sensor, or a two-dimensional area sensor. These sensors are designed such that the magnifications of optical images formed in defocused positions are equal and thereby the fields of view of the images are equal when focus is being detected. Additionally, in the case of the storage type sensor, equalizing the magnifications of optical images formed in defocused positions eliminates differences between the optical images and hence a lack of coincidence of times for the sensor to scan the optical images of the different magnifications.

The semiconductor pattern inspecting apparatus 10 having the foregoing configuration exerts focus control in the following manner. That is, the optical image of the subject W is formed onto the inspecting sensor 40 via the first imaging optical system 30. An output from the inspecting sensor 40 is input to an inspecting circuit 90 and subject to inspection. The inspecting circuit 90 inspects the image signal from the inspecting sensor 40 for defects in a pattern with the subject W.

On the other hand, the optical image of the first imaging optical system 30 is split by the first half mirror 61, and the split optical image thus obtained is formed on the AF sensor 70 by the second imaging optical system 60. A front focus image in which the point that is in focus is in front of the optical image on the inspecting sensor 40 is formed on, for example, the right half of the surface of the AF sensor 70. Likewise, a back focus image in which the point that is in focus is behind the optical image on the inspecting sensor 40 is formed on, for example, the left half of the surface of the AF sensor 70. The degree of front defocus and the degree of back defocus are preset equal to each other. Since the second imaging optical system 60 is a telecentric optical system, the front focus image and the back focus image have the same size.

On the AF sensor 70, the front and back focus images are formed as described above. Consequently, two image signals are output from the AF sensor 70 and are then input to the sensor data input circuit 81.

As shown in FIG. 2, a high-frequency component of each image is detected in the focus detecting circuit 82. From the high-frequency components of the front and back sensor images thus detected, their respective focus evaluation values are calculated and compared. Subsequently, the optimum focus position of the optical image on the inspecting sensor 40 and the required degree of defocus are calculated. The focus control circuit 83 controls the focusing of the objective lens 31 on the basis of the focus position calculated by the focus detecting circuit 82.

The operation of the focus detecting circuit 82 will be more fully described with reference to FIG. 3. Specifically, the high-frequency component of an image on the front focus side is detected, and then the high-frequency component of an image on the back focus side is detected. Next, the high-frequency components of the images on the front and back focus sides are compared to calculate the degree of defocus.

As shown in FIG. 3, an input image signal on the front focus side and an input image signal on the back focus side are processed in the following manner. The input image signal on the front focus side is subject to a differential operation in each of X and Y directions. Each result is then subject to the calculation of frequency distribution. The result of each frequency distribution is then subject to the calculation of the average of the densities of N % or more. Then, the maximum average density of the image on the front focus side is found from the averages of densities in the X and Y directions. Alternatively, the average of the densities of N % or more in the X direction and the average of the densities of N % or more in the Y direction are each squared and then the sum of the squared averages is calculated. Thus, the high-frequency component of the image on the front focus side is output. Likewise, the high-frequency component of the image on the back focus side is output. A difference between the high-frequency components is output as the degree of defocus.

FIG. 3 is one example of a block diagram showing an operating circuit used in the focus detecting device, and it should be noted that the block diagram can be variously modified.

FIG. 4 is an explanatory view showing example outputs from the inspecting sensor 40 and AF sensor 70. Specifically, when an L/S pattern image is formed on the inspecting sensor 40, an optical image on the front focus side of a sensor image formed on the inspecting sensor 40 is further projected on the front focus side of the AF sensor 70. Likewise, an optical image on the back focus side of the sensor image formed on the inspecting sensor 40 is further projected on the back focus side of the AF sensor 70. In FIG. 4, the focus position of the inspecting sensor 40 is on the front focus side, so that a sensor output amplitude on the front focus side of the AF sensor 70 is larger than the sensor output amplitude on the back focus side.

Figure 5:
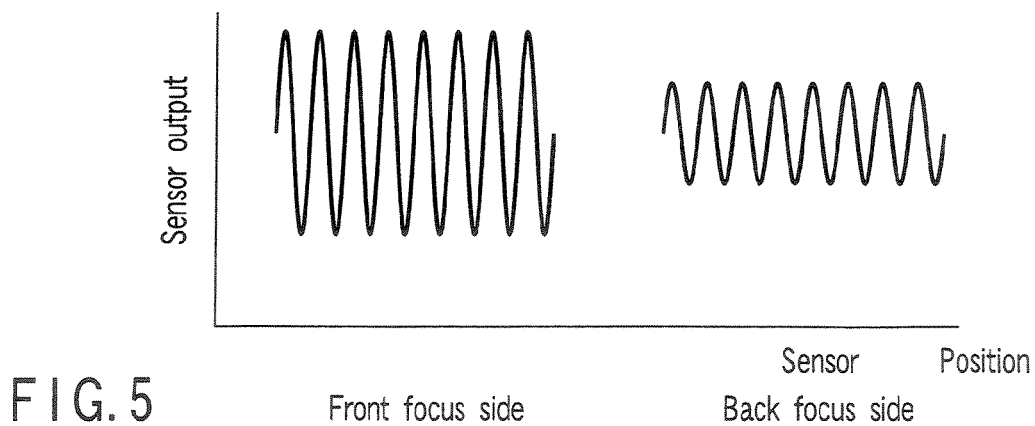
FIG. 5 is an explanatory view showing sensor outputs when a focus position of an inspecting sensor is on the front focus side.
Figure 6:
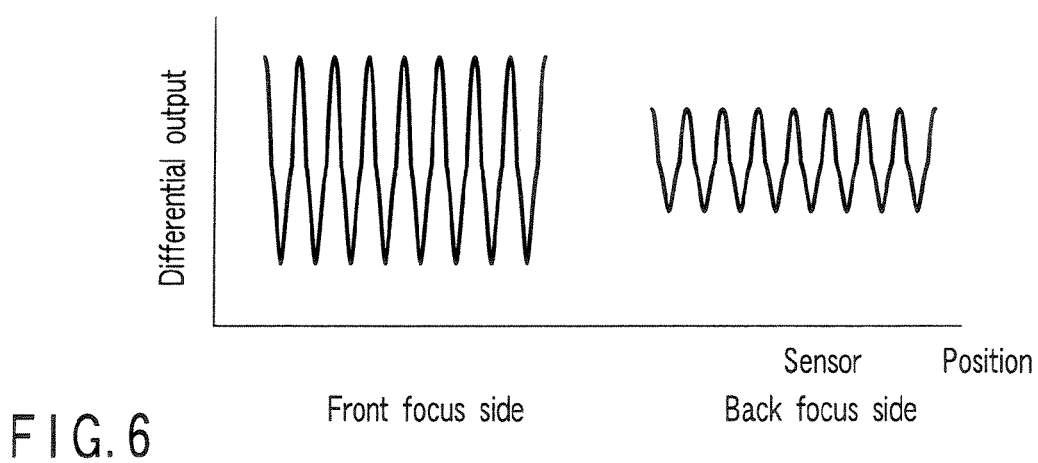
FIG. 6 is an explanatory view showing differential outputs when the focus position of the inspecting sensor is on the front focus side.
Figure 7:
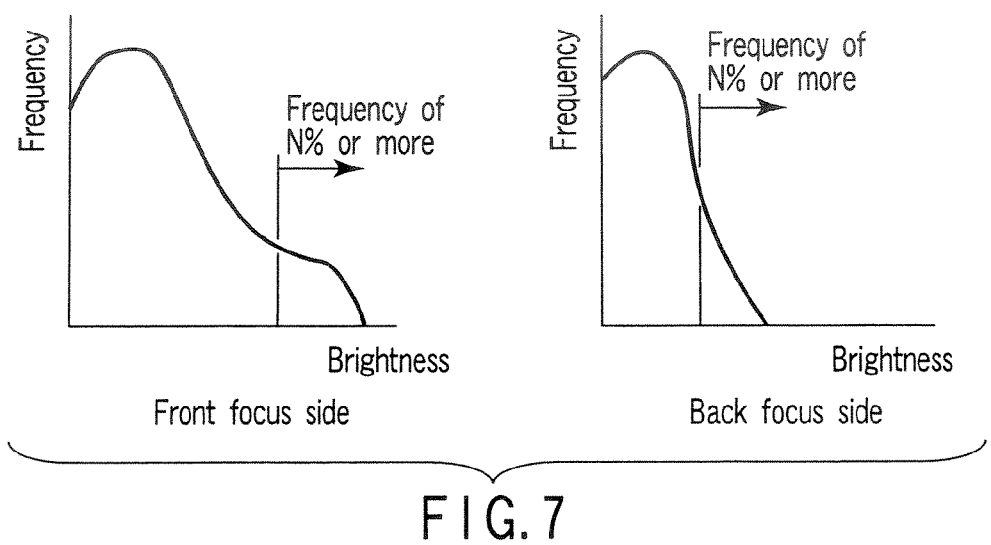
FIG. 7 is an explanatory view showing the relation between frequency distributions when the focus position of the inspecting sensor is on the front focus side.
Figure 8:
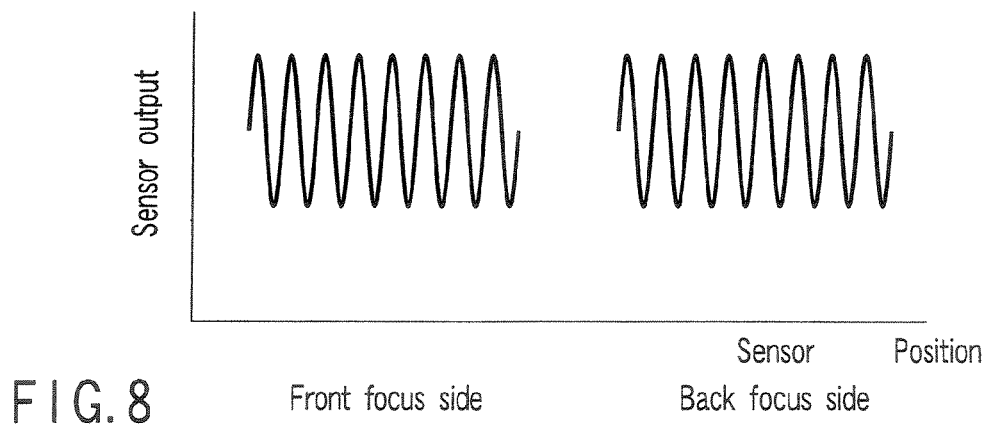
FIG. 8 is an explanatory view showing sensor outputs when the focus position of the inspecting sensor is precise.
Figure 9:
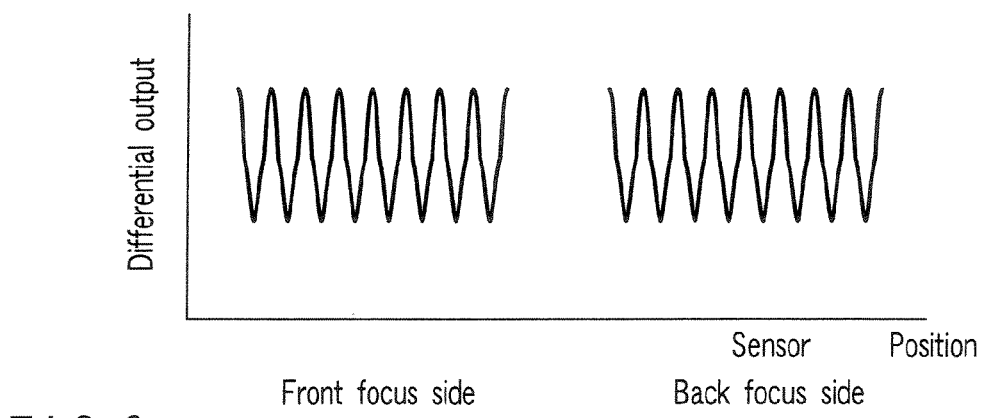
FIG. 9 is an explanatory view showing differential outputs when the focus position of the inspecting sensor is precise.
Figure 10:
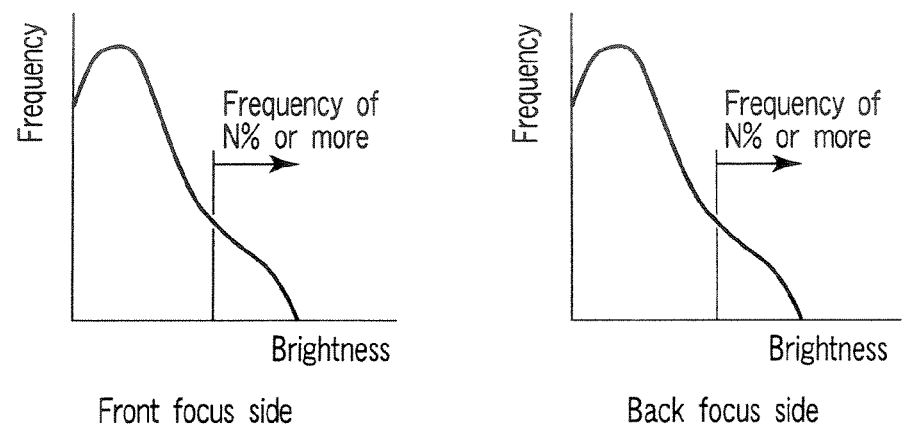
FIG. 10 is an explanatory view showing the relation between frequency distributions when the focus position of the inspecting sensor is precise.
Figure 11:
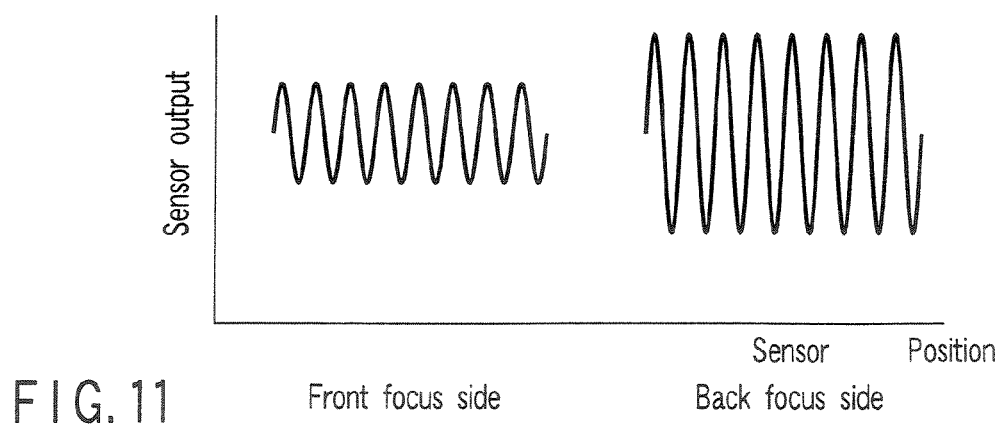
FIG. 11 is an explanatory view showing sensor outputs when the focus position of the inspecting sensor is on the back focus side.
Figure 12:
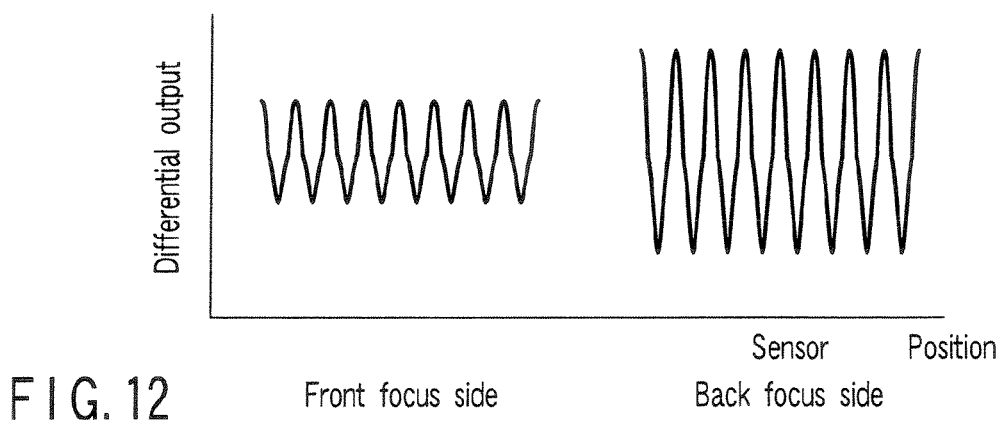
FIG. 12 is an explanatory view showing differential outputs when the focus position of the inspecting sensor is on the back focus side.
Figure 13:
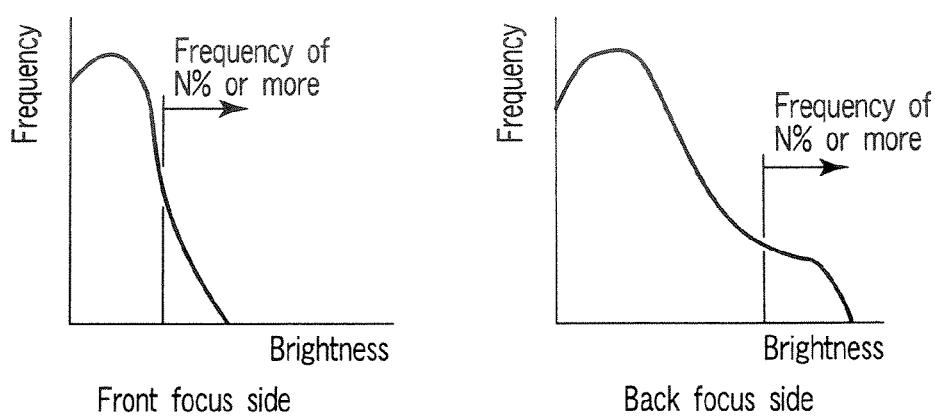
FIG. 13 is an explanatory view showing the relation between frequency distributions when the focus position of the inspecting sensor is on the back focus side.
Figure 15:
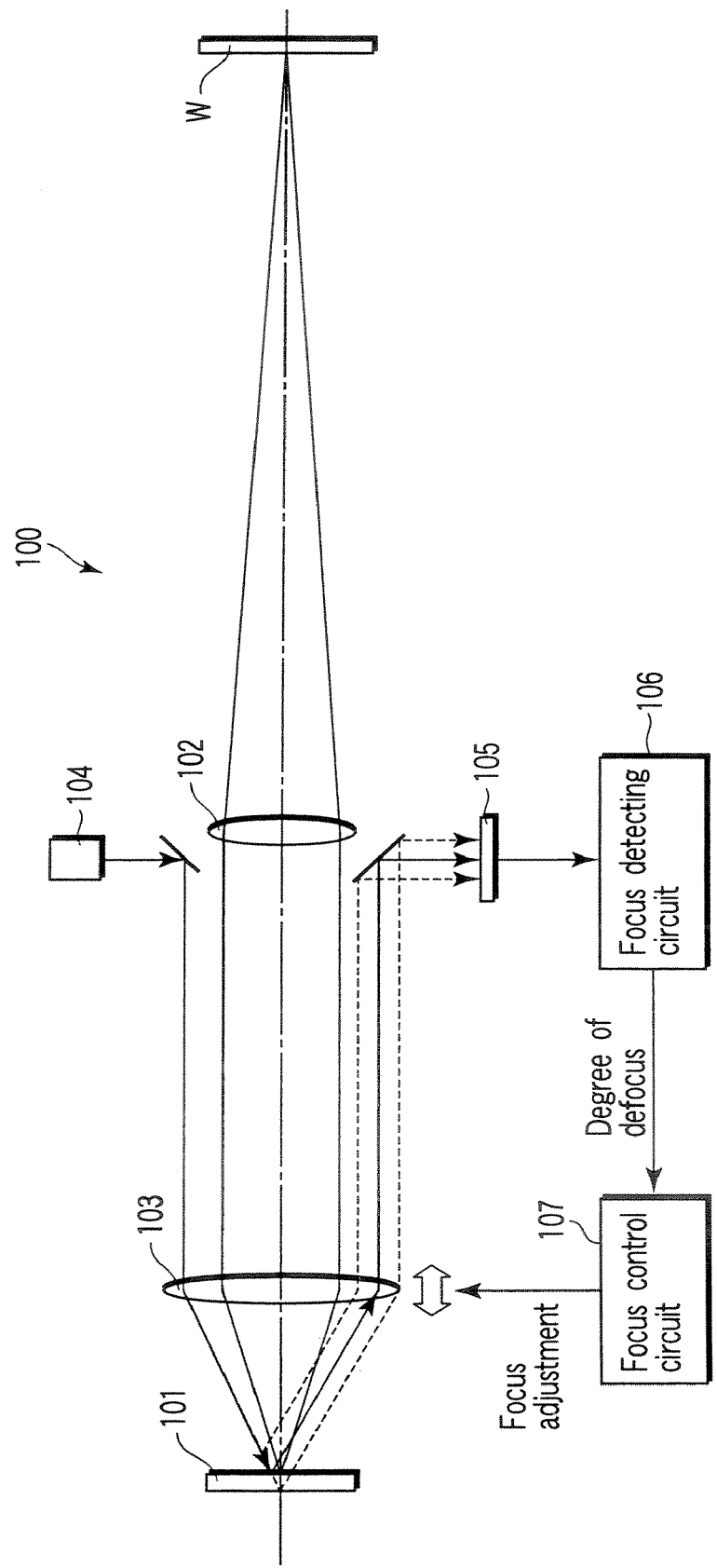
FIG. 15 is an explanatory view showing the configuration of a focusing mechanism that uses an optical lever method.

Next, detailed descriptions will be given of signal changes in the focus detecting circuit 82. FIGS. 5 to 7 show signal changes when the focus position of the inspecting sensor 40 is on the front focus side. FIGS. 8 to 10 show signal changes when the inspecting sensor 40 is precisely focused. FIGS. 11 to 13 show signal changes when the focus position of the inspecting sensor 40 is on the back focus side.

FIGS. 5, 6 and 7 show sensor outputs, differential outputs, and the relation between density distributions, respectively, when the focus position of the inspecting sensor 40 is on the front focus side. In this case, the amplitude of a sensor output on the front focus side is larger than that on the back focus side. The differential output signal on the front focus side is greater than that on the back focus side. Consequently, the frequency distribution of the differential output signal on the front focus side varies more widely in brightness than the frequency distribution of the differential output signal on the back focus side. In terms of the average of brightnesses of N % or more, the front focus side is brighter than the back focus side.

FIGS. 8, 9 and 10 show sensor outputs, differential outputs, and the relation between frequency distributions, respectively, when the inspecting sensor 40 is precisely focused. In this case, the amplitude of the sensor output on the front focus side and that on the back focus side are equal. The amplitude of the differential output signal on the front focus side and that on the back focus side are also equal. The front focus side and the back focus side thus exhibit the same frequency distribution of differential output signals in focus position. Both sides are also equal in the average of brightnesses of N % or more.

FIGS. 11, 12 and 13 show sensor outputs, differential outputs, and the relation between density distributions, respectively, when the focus position of the inspecting sensor 40 is on the back focus side. In this case, the amplitude of a sensor output on the back focus side is larger than that on the front focus side. The differential output signal on the back focus side is greater than that on the front focus side. Consequently, the frequency distribution of the differential output signal on the back focus side varies more widely in brightness than the frequency distribution of the differential output signal on the front focus side. In terms of the average of brightnesses of N % or more, the back focus side is brighter than the front focus side.

The average of brightnesses of N % or more indicates a high-frequency component of an image. In addition, the average of brightnesses of N % or more functions as an indicator whether the sensor is precisely focused or not. Accordingly, the average of brightnesses of N % or more can be used as a focus evaluation value, the reason for which will be more fully described below. FIG. 14 depicts the characteristics of changes in focus evaluation value, obtained from the high-frequency components of images on the front and back focus sides, when the focus position is changed from the front focus side to the back focus side. FIG. 14 also depicts values found by subtracting the focus evaluation value on the front focus side from that on the back focus side.

In other words, when the focus position is on the front focus side, the focus evaluation value on the front focus side is higher than that on the back focus side. As the focus position approaches the back focus side, the focus evaluation value on the back focus side increases. When the focus position is precise, on the other hand, the focus evaluation values on the front and back focus sides are equal and the difference between the focus evaluation values is therefore zero.

Accordingly, when the focus position is changed from the front focus side to back focus side, the output of the difference between the focus evaluation values gradually increases toward a zero-cross point where the focus position is precise. That is, the difference between the focus evaluation values makes it possible to determine whether the focus position is on the front or back focus side. Further, the output resulting from the gradual increase makes it possible to determine the degree of defocus.

Consequently, the difference between the focus evaluation values can be used as an indicator of the degree of defocus. Accordingly, focus can be controlled by outputting the degree of defocus to the focus control circuit 83.

In accordance with the semiconductor pattern inspecting apparatus 10 incorporating the focus detecting device 50 with the foregoing configuration, extracting the high-frequency signal out of the image signal on the front focus side and that on the back focus side to compare them makes it possible to precisely detect a focus even if the line width or pitch of a semiconductor pattern is not greater than the wavelength of the optical system. This provides a technique for highly precise measurement and inspection.

The foregoing are the descriptions of the focus detecting device 50 incorporated in the semiconductor pattern inspecting apparatus 10. It will be appreciated that the focus detecting device 50 can also be applied in general optical measurement and/or inspection apparatus.

In the present embodiment, not only a semiconductor but also a photo mask or the like can be used as a subject. Even when a pattern is inspected on a photo mask as a subject, the same effects can be obtained by performing a focusing operation, etc., using the procedure described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A focusing device comprising:
   first and second sensors which convert an optical image of a subject, formed on a plane of incidence, into an image signal and output the image signal;
   a first imaging optical system which forms the optical image on the first sensor;
   a second imaging optical system which splits the optical image from the first imaging optical system in the direction of the second sensor and further splits the optical image into two so that a front focus image in which the point that is in focus is in front of the optical image on the first sensor and a back focus image in which the point that is in focus is behind the optical image on the first sensor are formed on the second sensor;
   a focus detecting circuit which detects an optimum focus position of the optical image on the first sensor by calculating a focus evaluation value from a high-frequency component of a front sensor image in a front focus position obtained from the second sensor and a focus evaluation value from a high-frequency component of a back sensor image in a back focus position obtained from the second sensor and by comparing the focus evaluation values; and
   a focus control circuit which controls the focusing of the first imaging optical system on the basis of the focus position detected by the focus detecting circuit.

2. A focusing device according to claim 1, wherein the second imaging optical system has a telecentric optical system which equalizes the optical magnifications of the front and back focus images regardless of the focus position.

3. A focusing device according to claim 1, wherein the first and second sensors are a line sensor, a storage sensor, or a two-dimensional area sensor.

4. A focusing device according to claim 1, wherein the second imaging optical system includes a half mirror arranged on the first imaging optical system, the half mirror splitting the optical image in the direction of the second sensor.

5. A focusing method comprising:
   forming an optical image on a first sensor;
   converting the optical image formed on the first sensor into an image signal and outputting the image signal as a first image signal;
   splitting the optical image in the direction of the second sensor and further splitting the optical image into two so that a front focus image in which the point that is in focus is in front of the optical image on the first sensor and a back focus image in which the point that is in focus is behind the optical image on the first sensor are formed on the second sensor;
   converting the optical image formed on the first sensor into an image signal and outputting the image signal as a second image signal;
   detecting an optimum focus position of the optical image on the first sensor from the second image signal by calculating a focus evaluation value from a high-frequency component of a front sensor image in a front focus position and a focus evaluation value from a high-frequency component of a back sensor image in a back focus position and by comparing the focus evaluation values; and
   controlling the focusing of the first imaging optical system on the basis of the detected focus position.

6. A pattern inspecting apparatus comprising:
   first and second sensors which convert an optical image of a subject, formed on a plane of incidence, into an image signal and output the image signal;
   a first imaging optical system which forms the optical image on the first sensor;
   a second imaging optical system which splits the optical image from the first imaging optical system in the direction of the second sensor and further splits the optical image into two so that a front focus image in which the point that is in focus is in front of the optical image on the first sensor and a back focus image in which the point that is in focus is behind the optical image on the first sensor are formed on the second sensor;
   a focus detector which detects an optimum focus position of the optical image on the first sensor by calculating a focus evaluation value from a high-frequency component of a front sensor image in a front focus position obtained from the second sensor and a focus evaluation value from a high-frequency component of a back sensor image in a back focus position obtained from the second sensor and by comparing the focus evaluation values;
   a focus controller which controls the focusing of the first imaging optical system on the basis of the focus position detected by the focus detector; and
   an inspector which inspects the image signal from the first sensor for defects in a pattern with the subject.

* * * * *